(12) United States Patent
Wallace et al.

(10) Patent No.: US 11,664,274 B2
(45) Date of Patent: May 30, 2023

(54) METHOD TO REPAIR EDGE PLACEMENT ERRORS IN A SEMICONDUCTOR DEVICE

(71) Applicant: Intel Corporation, Santa Clara, CA (US)

(72) Inventors: Charles H. Wallace, Portland, OR (US); Mohit K. Haran, Hillsboro, OR (US); Gopinath Bhimarasetti, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 857 days.

(21) Appl. No.: 16/421,184

(22) Filed: May 23, 2019

(65) Prior Publication Data

US 2020/0373201 A1 Nov. 26, 2020

(51) Int. Cl.
*H01L 21/768* (2006.01)
*H01L 23/522* (2006.01)
*H01L 21/033* (2006.01)
*H01L 23/528* (2006.01)
*H01L 21/311* (2006.01)

(52) U.S. Cl.
CPC .... *H01L 21/76877* (2013.01); *H01L 21/0337* (2013.01); *H01L 21/31144* (2013.01); *H01L 21/76897* (2013.01); *H01L 23/5226* (2013.01); *H01L 23/5283* (2013.01)

(58) Field of Classification Search
CPC .......... H01L 21/76877; H01L 21/0337; H01L 21/31144; H01L 21/76897; H01L 23/5226; H01L 23/5283
USPC ........................................................ 257/774
See application file for complete search history.

(56) References Cited

U.S. PATENT DOCUMENTS

2018/0114721 A1* 4/2018 Mohanty ........... H01L 21/76811
2019/0295943 A1* 9/2019 Tan ................... H01L 21/76816

* cited by examiner

*Primary Examiner* — Matthew E. Gordon
(74) *Attorney, Agent, or Firm* — Schwabe, Williamson & Wyatt, P.C.

(57) ABSTRACT

Embodiments disclosed herein include edge placement error mitigation processes and structures fabricated with such processes. In an embodiment, a method of fabricating an interconnect layer over a semiconductor die comprises forming a patterned layer over a substrate, disposing a resist layer over the patterned layer and patterning the resist layer to expose portions of the patterned layer. In an embodiment, overlay misalignment during the patterning results in the formation of edge placement error openings. In an embodiment, the method further comprises correcting the edge placement error openings, and patterning an opening into the substrate after correcting edge placement error openings.

5 Claims, 17 Drawing Sheets

METHOD TO REPAIR EDGE PLACEMENT ERRORS IN A SEMICONDUCTOR DEVICE

TECHNICAL FIELD

Embodiments of the disclosure are in the field of semiconductor structures and processing and, in particular, to methods for repairing edge placement errors in the manufacture of semiconductor devices.

BACKGROUND

In back end of line (BEOL) fabrication, conductive vias and insulative plugs are needed in order to provide the desired electrical routing between layers of the BEOL stack. During the fabrication of the vias and plugs, edge placement errors may generate defects in the device. For example, edge placement errors may result in the creation of unwanted vias that result in undesirable shorts in the BEOL stack. In some BEOL stacks, gratings (which include alternating lines of dielectric materials that are etch selective to each other) are used to provide increased overlay margins to avoid edge placement errors. However, as critical dimensions continue to scale, the widths of the gratings decreases. Accordingly, the margins for edge placement error continue to decrease.

DESCRIPTION OF THE EMBODIMENTS

Figure 1A:
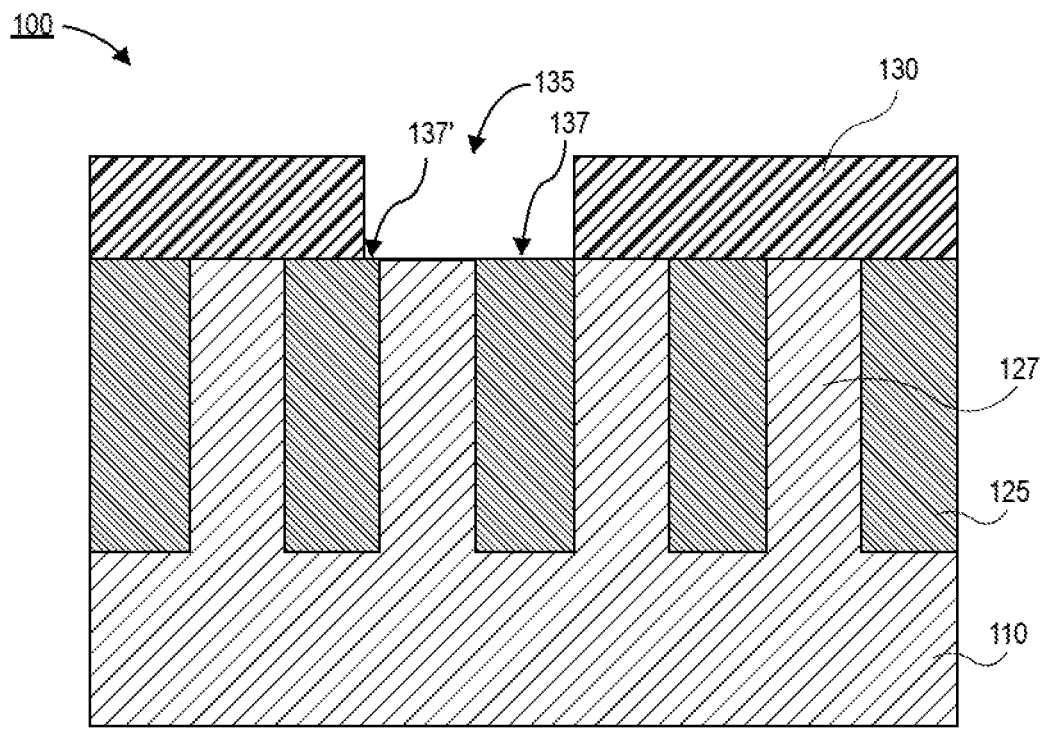
FIG. 1A is a cross-sectional illustration of a grating over a substrate with a resist layer that has a misaligned opening.

Embodiments described herein comprise semiconductor devices and methods of forming such devices using edge placement error correction. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Figure 1B:
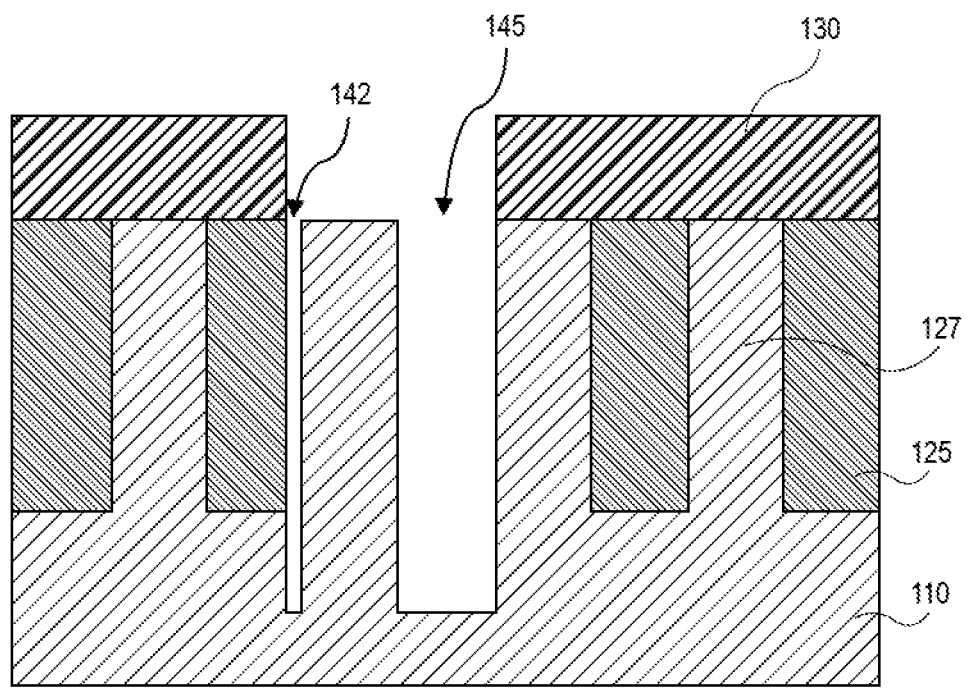
FIG. 1B is a cross-sectional illustration after the grating is patterned and an edge placement error opening is created.

As noted above, edge placement error can result in unwanted vias or other defects in a back end of line (BEOL) stack of a die. FIGS. 1A and 1B provide an example of how edge placement errors can result in unwanted defects in a device. In FIG. 1A, a cross-sectional illustration of a BEOL stack 100 that comprises a substrate 110 and a grating over the substrate 110. The grating may include alternating first lines 125 with a first dielectric material and second lines with a second dielectric material 127. A misaligned opening 135 in the resist layer 130 is shown. As shown, the opening 135 exposes a top surface 137 of a first line 125 and a portion of a top surface 137' of a neighboring first line 125. Accordingly, removal of the targeted first line 125 below surface 137 results in the unintentional removal of a portion of the neighboring first line 125 below surface 137'. This results in the formation of a desired opening 145 and a second opening 142 that will result in a defect in the BEOL stack 100 as shown in FIG. 1B.

Accordingly, embodiments disclosed herein include methods for correcting the edge placement error before the edge placement error is patterned into the underlying substrate. As such, the margin for error is increased and scaling to smaller critical dimensions is more easily enabled. Whereas existing solutions are limited to misalignments equal to or less than the width of a single line 125, 127 of the grating, embodiments allow for larger misalignments since edge placement errors are mitigated prior to patterning the underlying substrate.

Figure 2B:
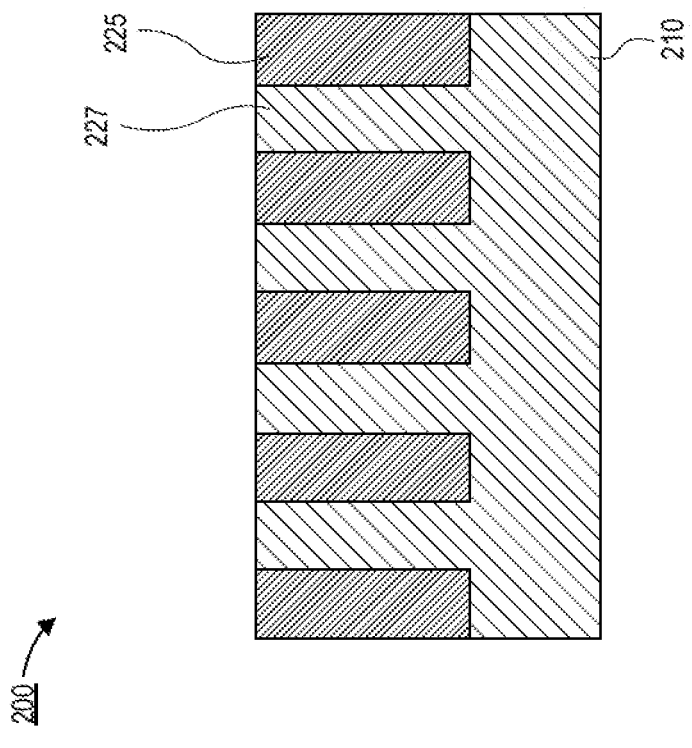
FIG. 2B is a cross-sectional illustration of the BEOL stack of FIG. 2A along line B-B', in accordance with an embodiment.
Figure 2A:
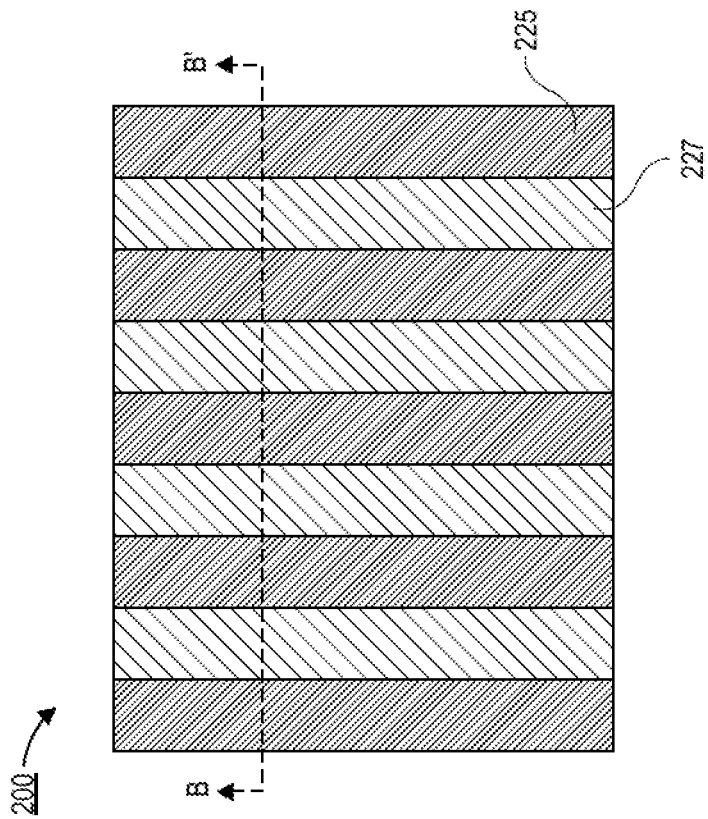
FIG. 2A is a plan view illustration of BEOL stack with a grating over a substrate, in accordance with an embodiment.
Figure 2D:
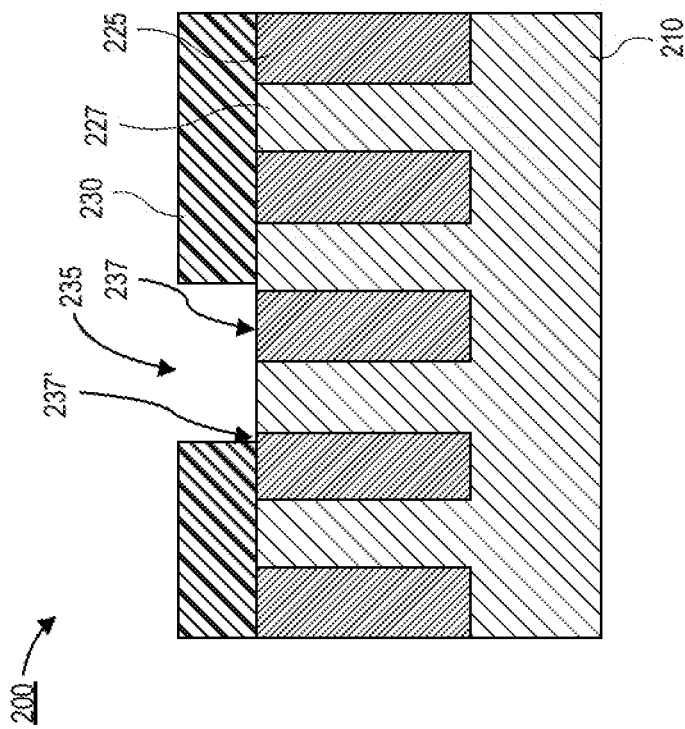
FIG. 2D is a cross-sectional illustration of the BEOL stack of FIG. 2C along line D-D', in accordance with an embodiment.
Figure 2C:
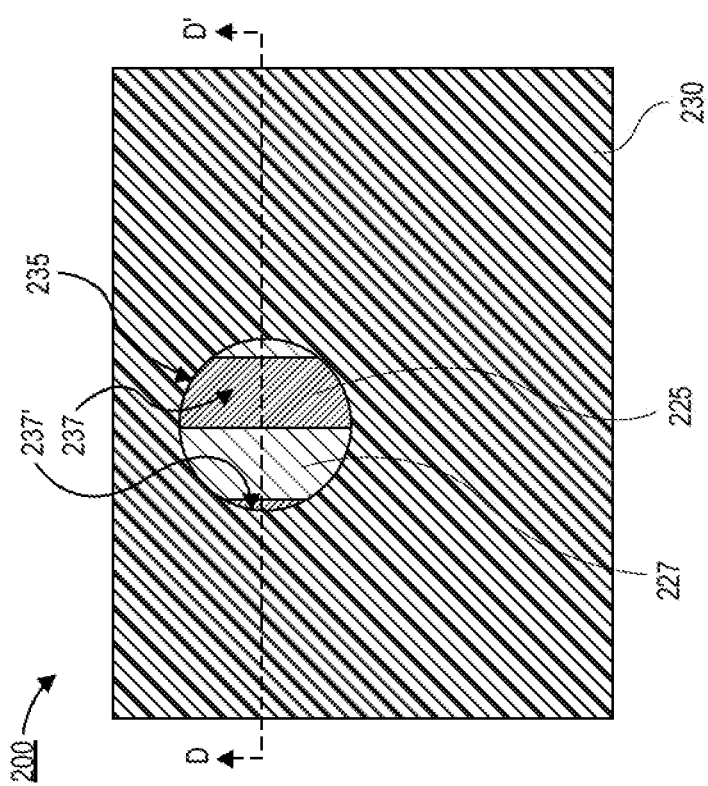
FIG. 2C is a plan view illustration of the BEOL stack after a resist layer with an opening is disposed over the grating, in accordance with an embodiment.
Figure 2F:
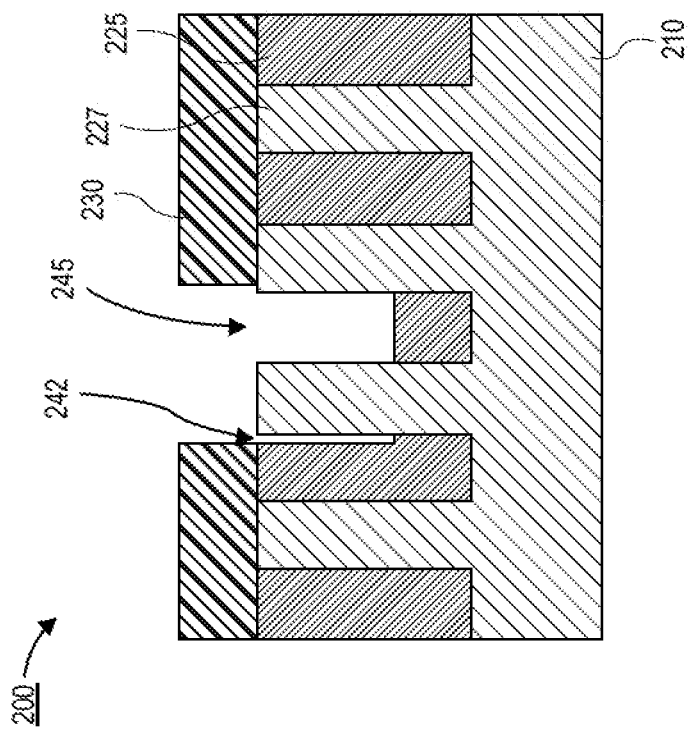
FIG. 2F is a cross-sectional illustration of the BEOL stack in FIG. 2E along line F-F', in accordance with an embodiment.
Figure 2E:
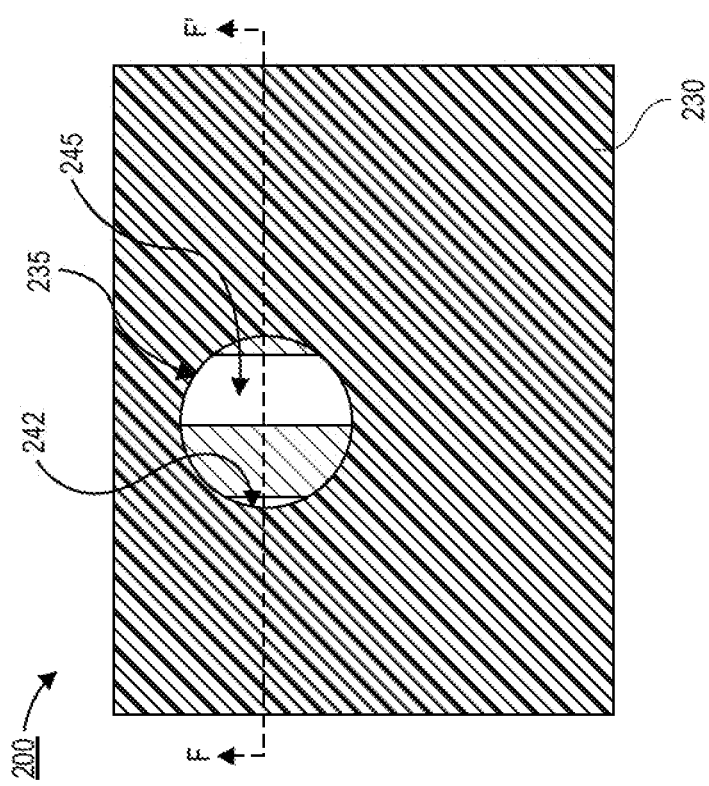
FIG. 2E is a plan view illustration of the BEOL stack after first lines of the grating are recessed, in accordance with an embodiment.
Figure 2H:
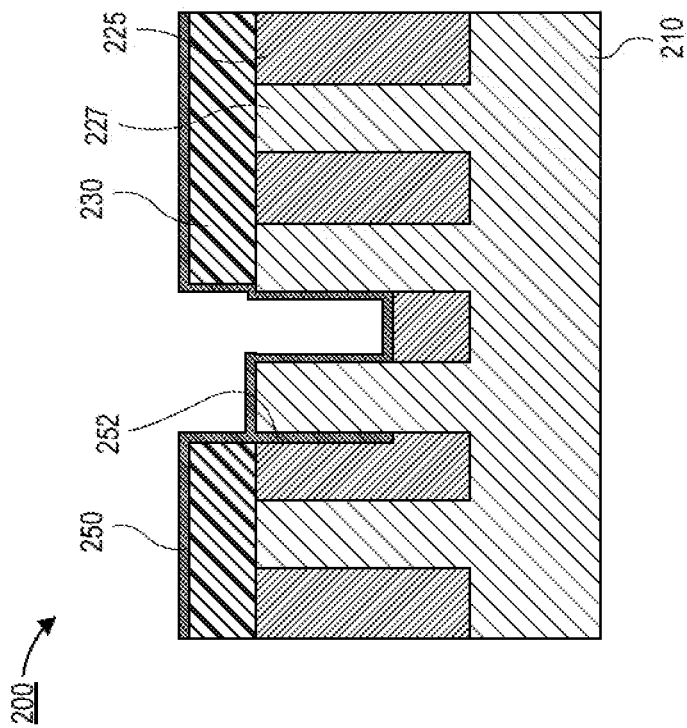
FIG. 2H is a cross-sectional illustration of the BEOL stack in FIG. 2G along line H-H', in accordance with an embodiment.
Figure 2G:
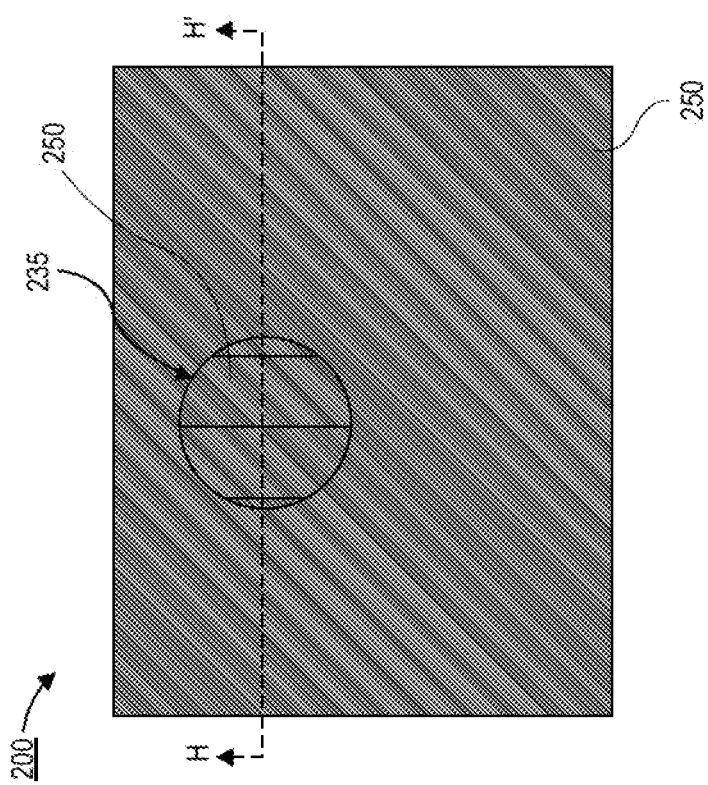
FIG. 2G is a plan view illustration of the BEOL stack after a mask layer is conformally deposited over exposed surfaces, in accordance with an embodiment.
Figure 2J:
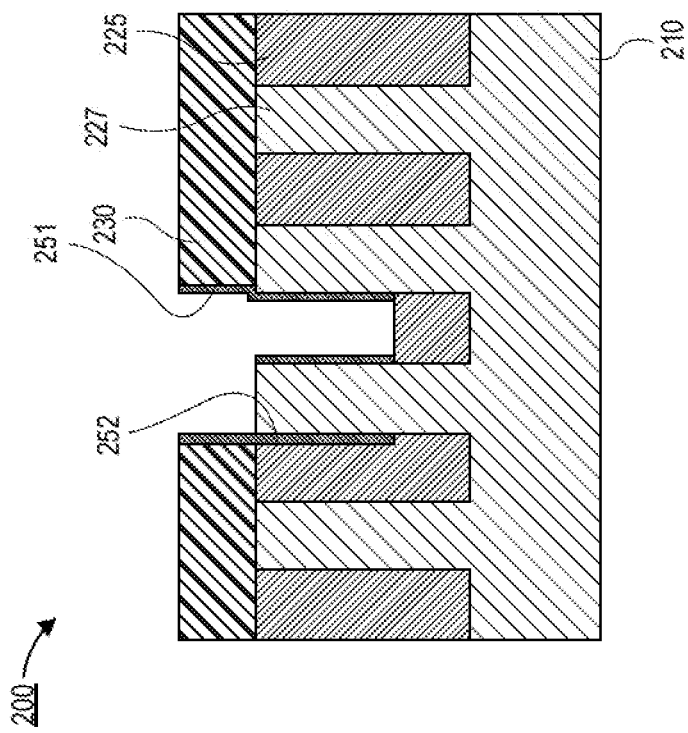
FIG. 2J is a cross-sectional illustration of the BEOL stack in FIG. 2I along line J-J', in accordance with an embodiment.
Figure 2I:
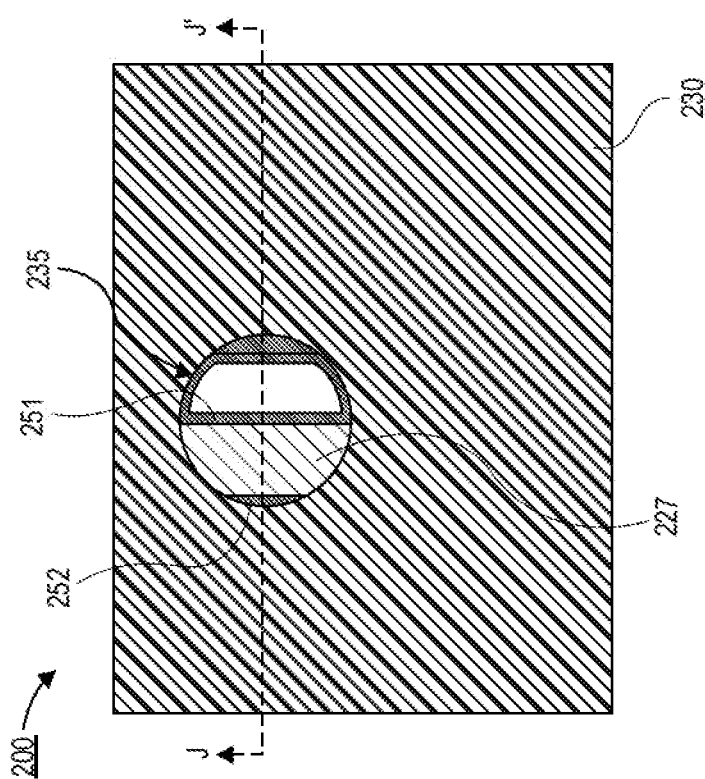
FIG. 2I is a plan view illustration of the BEOL stack after the mask layer is removed from horizontal surfaces, in accordance with an embodiment.
Figure 2L:
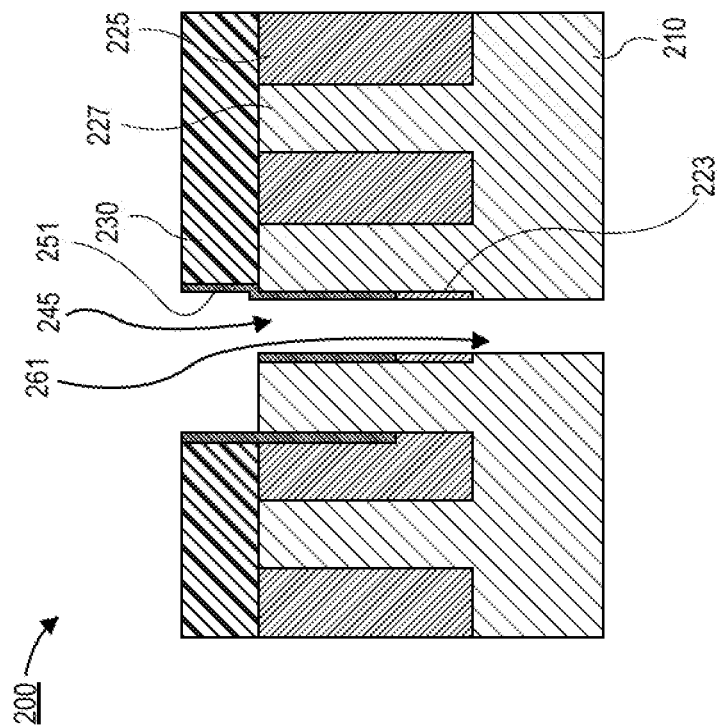
FIG. 2L is a cross-sectional illustration of the BEOL stack in FIG. 2K along line L-L', in accordance with an embodiment.
Figure 2K:
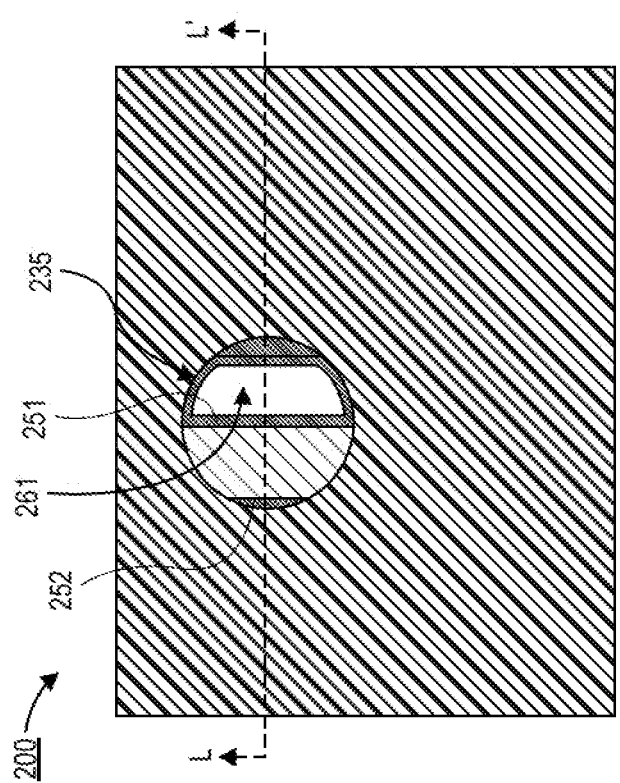
FIG. 2K is a plan view illustration of the BEOL stack after an opening is patterned in the substrate, in accordance with an embodiment.
Figure 2N:
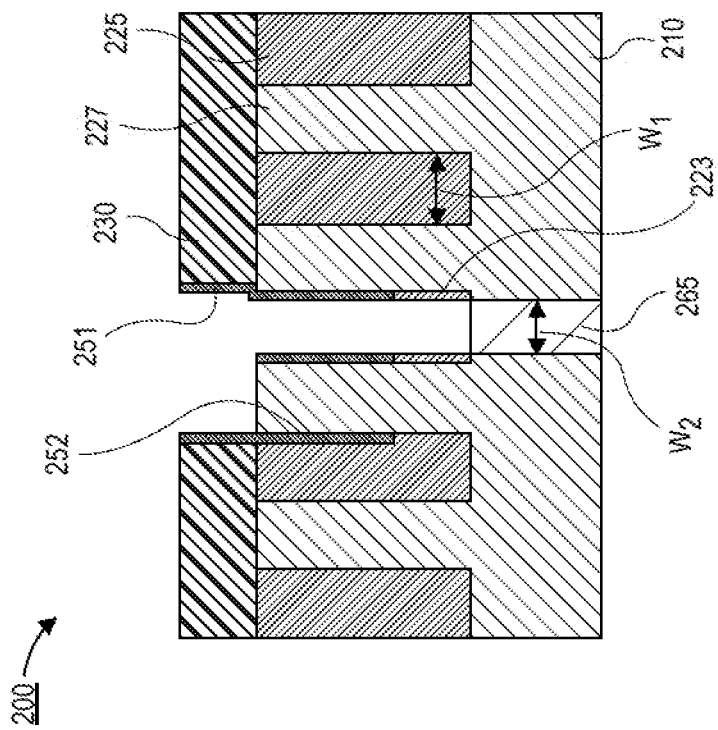
FIG. 2N is a cross-sectional illustration of the BEOL stack in FIG. 2M along line N-N', in accordance with an embodiment.

Referring now to FIGS. 2A-2N, a series of plan view and corresponding cross-sectional illustrations that depict an edge placement error mitigation scheme is shown, in accordance with an embodiment.

Referring now to FIGS. 2A and 2B, a plan view illustration of a BEOL stack 200 and a cross-sectional illustration along line B-B' are shown, in accordance with an embodiment. In an embodiment, the BEOL stack 200 may comprise a substrate 210 and a grating over the substrate 210. In an embodiment, the substrate 210 may be an interlayer dielectric (ILD) of a BEOL stack. While the substrate 210 is shown as a single monolithic structure, it is to be appreciated that the substrate 210 may comprise conductive traces, dielectric layers, or the like. In the illustrated embodiment, a single layer of the substrate 210 is shown. However, it is to be appreciated that the substrate 210 may comprise a plurality of layers (e.g., metal layers and ILDs) as is known in the art of BEOL stacks. In an embodiment, as used throughout the present description, ILD material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, silicon nitride, aluminum oxide, Si, TiN, SiON, SiOCN, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, the substrate 210 may be disposed over a semiconductor substrate (not shown). That is, the BEOL stack 200 may be positioned over a semiconductor substrate as is typical of dies, chips, etc. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The semiconductor substrate, depending on the stage of manufacture, often includes transistors, integrated circuitry, and the like. The substrate may also include semiconductor materials, metals, dielectrics, dopants, and other materials commonly found in semiconductor substrates.

In an embodiment, the grating may comprise alternating first lines 225 and second lines 227. The first lines 225 may comprise a first dielectric material and the second lines 227 may comprise a second dielectric material. The first dielectric material may be etch selective to the second dielectric material. In some embodiments, one of the first lines 225 and the second lines 227 may comprise the same dielectric material used in the substrate 210. In other embodiments, the first lines 225 and the second lines 227 may comprise different dielectric materials than the dielectric material of the substrate 210. In an embodiment, the first lines 225 and/or the second lines 227 may be a carbon hardmask. The widths of the first lines 225 and the second lines 227 may be substantially the same. In other embodiments, the first lines 225 and the second lines 227 may have different widths. In some embodiments, the widths of the first lines 225 and the second lines 227 may be substantially similar to widths of conductive traces (not shown) included in the substrate 210. While reference herein is made to the use of edge placement mitigation solutions used in conjunction with gratings, it is to be appreciated that substantially edge placement mitigation solutions may be used in conjunction with other patterned layers, such as cross-gratings or patterned layers with openings of any size and/or shape.

Referring now to FIGS. 2C and 2D, a plan view illustration and a corresponding cross-sectional illustration of the BEOL stack 200 along line D-D' after a resist layer 230 is disposed over the grating and patterned are shown, respectively, in accordance with an embodiment. An opening 235 may be patterned with a lithography process, as is known in the art. The opening 235 may be used in conjunction with the grating to define one or more features in substrate 210. For example, the opening 235 may be used to form openings in the substrate 210 where vias, plugs, cuts, or the like are desired.

In some embodiments, the opening 235 may have an edge placement error that exceeds the overlay margins of the grating. That is, an opening 235 that is only supposed to expose a portion of a single first line 225 (e.g., surface 237) may also expose a portion of a neighboring first line 225 (e.g., surface 237'). Such an edge placement error would typically result in significant defects in the device, as described above. However, embodiments disclosed herein include edge placement error mitigation schemes to prevent such defects.

Referring now to FIGS. 2E and 2F, a plan view illustration and a corresponding cross-sectional illustration along line F-F' after the exposed portions of the first lines 225 are recessed are shown, respectively, in accordance with an embodiment. In an embodiment, the first lines 225 may be recessed to form an opening 245 between two second lines 227 (i.e., the desired opening) and a partial opening 242 into an adjacent first line 225 (i.e., the edge placement error opening). The first lines 225 may be recessed with any suitable etching process. For example, a timed etch may be used to recess, but not entirely remove the exposed portions of the first lines 225.

Referring now to FIGS. 2G and 2H, a plan view illustration and a corresponding cross-sectional illustration along line H-H' after a mask layer 250 is disposed over exposed surfaces are shown, respectively, in accordance with an embodiment. In an embodiment, the mask layer 250 is disposed with a conformal deposition process. The use of a conformal deposition process provides a layer that conforms to the horizontal and vertical exposed surfaces of the BEOL stack 200. Furthermore, the conformal deposition allows for the edge placement error opening 242 to be substantially filled with a portion 252 of the mask layer 250. In an embodiment, the mask layer 250 may be deposited with any suitable conformal deposition process. For example, the mask layer 250 may be deposited with an atomic layer deposition (ALD) process, a conformal CVD process, or the like. In an embodiment, the thickness of the mask layer 250 may be sufficient to substantially fill the edge placement error opening 242. In an embodiment, the mask layer 250 may be a material that is etch selective to the first lines 225. In an embodiment, the mask layer 250 may be a dielectric material (e.g., an oxide, a nitride, or the like) or a metallic material. For example, the mask layer 250 may comprise silicon nitride, aluminum oxide, Si, TiN, SiON, SiOC, SiOCN, or the like.

Referring now to FIGS. 2I and 2J, a plan view illustration and a corresponding cross-sectional illustration along line J-J' after the mask layer 250 is preferentially etched and the opening is transferred into the substrate 210 are shown, respectively, in accordance with an embodiment. In an embodiment, the mask layer 250 is preferentially etched in order to remove portions of the mask layer 250 along horizontal surfaces of the BEOL stack 200. That is, residual portions 251 of the mask layer 250 may remain along vertical surfaces of the BEOL stack 200. Furthermore, the portion 252 of the mask layer 250 in the edge placement error opening 242 remains. In an embodiment, the mask layer 250 may be preferentially etched with an anisotropic etching process.

Referring now to FIGS. 2K and 2L, a plan view illustration and a corresponding cross-sectional illustration along line L-L' after the horizontal surfaces of the mask layer 250 are removed, the exposed portion of the first line 225 at the bottom of opening 245 is removed. In some embodiments, sidewall portions 223 of the first line 225 may remain as they are masked by sidewall portions 251 of the mask layer 250. In an embodiment, the opening 245 may then be transferred into the substrate 210 to form substrate opening 261.

Figure 2M:
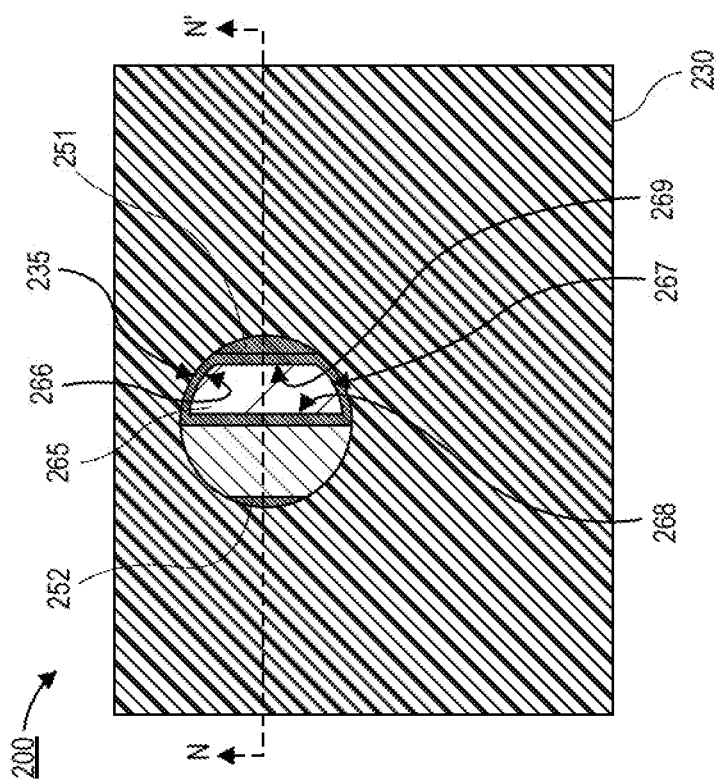
FIG. 2M is a plan view illustration of the BEOL stack after a fill material is disposed in the opening in the substrate, in accordance with an embodiment.

Referring now to FIGS. 2M and 2N, a plan view illustration and a corresponding cross-sectional illustration along line N-N' after a fill material 265 is disposed in the opening 261 are shown, respectively, in accordance with an embodi-ment. In an embodiment, the fill material 265 may be a conductive material. For example, a conductive fill material 265 may be used to provide a conductive via between interconnect lines in different layers of the BEOL stack. In other embodiments, the fill material 265 may be an insulating material. For example, an insulating fill material 265 may be used to provide a plug or cut along an interconnect line in the substrate 210. While reference herein is made to the use of edge placement error mitigation in the context of the BEOL stack, it is to be appreciated that substantially similar processing may be implemented in front end of line (FEOL) applications.

In an embodiment, the fill material 265 may have a cross-section (along the plane shown in FIG. 2M) that is defined in part by the resist layer 230, the second lines 227, and the vertical portions 251 of the mask layer. For example, the fill material 265 may comprise a first sidewall surface 268, a second sidewall surface 269 opposing the first sidewall surface 268, a third sidewall surface 266, and a fourth sidewall surface 267 opposing the third sidewall surface 266. In an embodiment, the first sidewall surface 268 and the second sidewall surface 269 may be substantially parallel to each other since the surfaces 268 and 269 are defined by the second lines 227 (and the vertical portions 251 of the mask layer conformally deposited onto the sidewall surfaces of the second lines 227). In an embodiment, the third sidewall surface 266 and the fourth sidewall surface 267 may not be parallel to each other since they are defined by the opening 235 in the resist layer 230. However, in some embodiments, the opening 235 may be substantially rectangular (instead of circular as shown in FIG. 2M). In such instances, the third sidewall surface 266 may be substantially parallel to the fourth sidewall surface 267.

In an embodiment, the first lines 225 may have a first width $W_1$ and the fill material 265 may have a second width $W_2$ that is smaller than the first width $W_1$. The second width $W_2$ of the fill material 265 may be smaller than the first width $W_1$ of the first lines 225 since vertical portions 251 of the mask layer and residual sidewall portions 223 of the first line 225 may mask off a portion of the substrate 210.

Figure 2O:
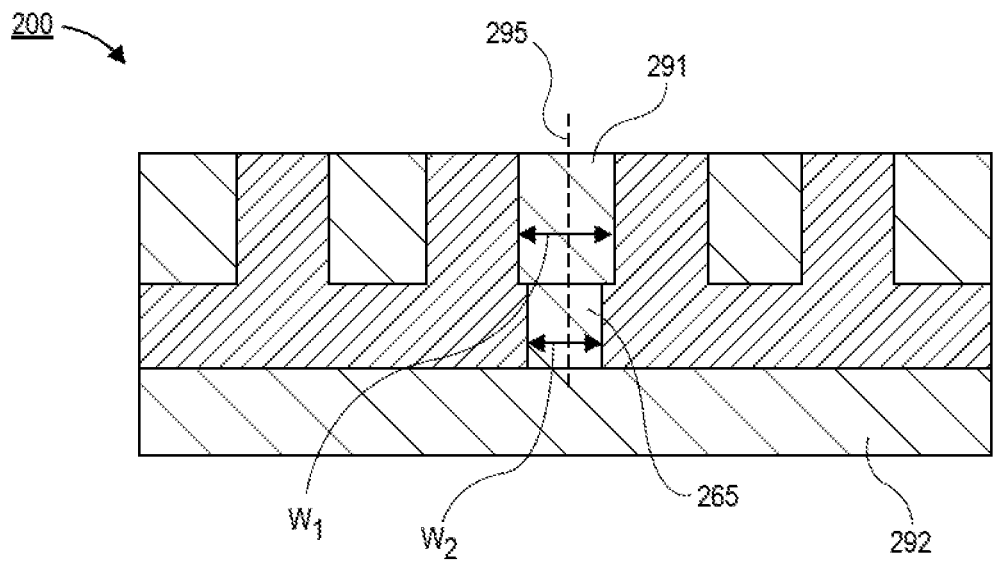
FIG. 2O is a cross-sectional illustration of the BEOL stack after a subsequent metal layer is formed and the fill material provides a conductive via between an overlying interconnect and an underlying interconnect, in accordance with an embodiment.

Referring now to FIG. 2O, a cross-sectional illustration of the BEOL stack 200 of FIG. 2N after subsequent processing is implemented to form a metal layer over the fill material 265 is shown, in accordance with an embodiment. In the illustrated embodiment, the fill material 265 may be a conductive material in order to provide a via between interconnects (i.e., between interconnect 291 above fill material 265 and interconnect 292 below fill material 265). As shown, interconnects 291 may be disposed in locations where the first lines 225 were previously located. Accordingly, the interconnects 291 may have substantially the same first width $W_1$ as the first lines 225. As such, the interconnect 291 may have a first width $W_1$ that is greater than the second width $W_2$ of the fill material 265. Furthermore, since the fill material 265 is fabricated using the processes described above, the fill material 265 (i.e., the via) is substantially aligned with the interconnect 291. That is, interconnect 291 and fill material 265 (i.e., the via) may share a centerline 295.

Figure 2P:
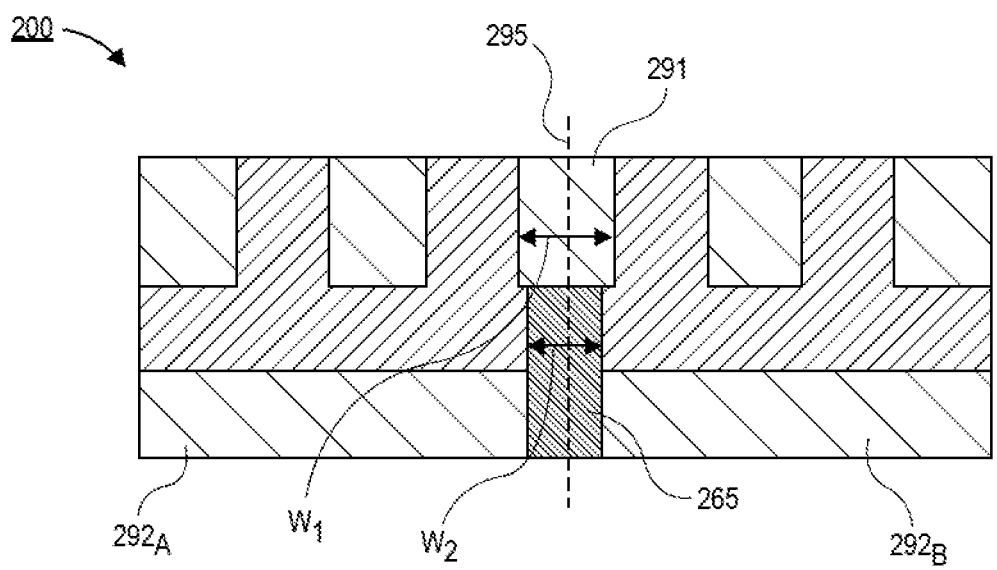
FIG. 2P is a cross-sectional illustration of the BEOL stack after a subsequent metal layer is formed over the fill material, and the fill material is shown as providing a plug in the interconnect in the substrate, in accordance with an embodiment.

Referring now to FIG. 2P, a cross-sectional illustration of the BEOL stack 200 of FIG. 2N after subsequent processing is implemented to form a metal layer over the fill material 265 is shown, in accordance with an embodiment. In the illustrated embodiment, the fill material 265 is an insulating material in order to form a plug between the interconnect 292A and interconnect 292B. In an embodiment, the fill material 265 may extend above a top surface of the interconnect 292 up to an overlying interconnect 291. In an embodiment, a width $W_2$ of the fill material 265 (i.e., the plug) may be less than a width $W_1$ of the overlying interconnect 291. In some embodiments, the fill material 265 (i.e., the plug) may share a centerline 295 with the overlying interconnect 291.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In FIGS. 2O and 2P, the first lines 225 have been entirely removed, in addition to removing any residual portions of the mask layer (i.e., portions 252 filling the edge placement error opening and vertical portions 251). In other embodiments, some or all of the first lines 225 and/or some or all residual portions 251, 252 of the mask layer may remain in the final product. That is, in some embodiments, a cross-sectional analysis of the device may exhibit a layer that comprises a first ILD material with small slivers of a second ILD material (i.e., portions 252). The second ILD material may have a different material composition than a material composition of the first ILD and/or the second ILD may have a different crystal structure than the first ILD. However, it is to be appreciated that even when the residual portions 251, 252 of the mask layer 250, and/or the first lines 225 are removed, artifacts of the processing may still remain in the final structure. For example, a width of the fill material may be smaller than a width of the overlying interconnects, a centerline of the fill material may be coincident with a centerline of an overlying interconnect, and/or the fill material may have a pair of opposing sidewall surfaces that are parallel, and a pair of opposing sidewall surfaces that are non-parallel.

Figure 3A:
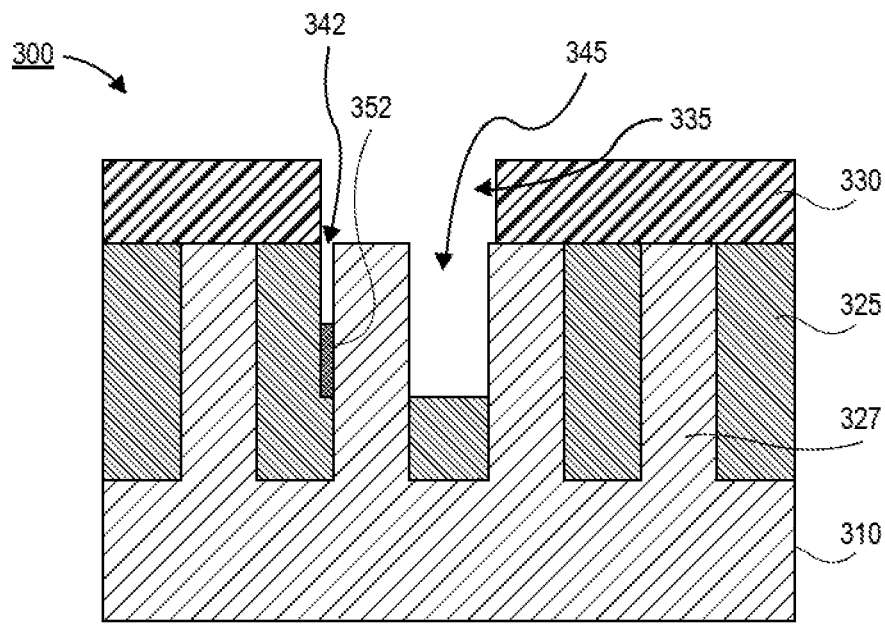
FIG. 3A is a cross-sectional illustration of a BEOL stack after the mask layer is etched with an isotropic etching process, in accordance with an embodiment.
Figure 3B:
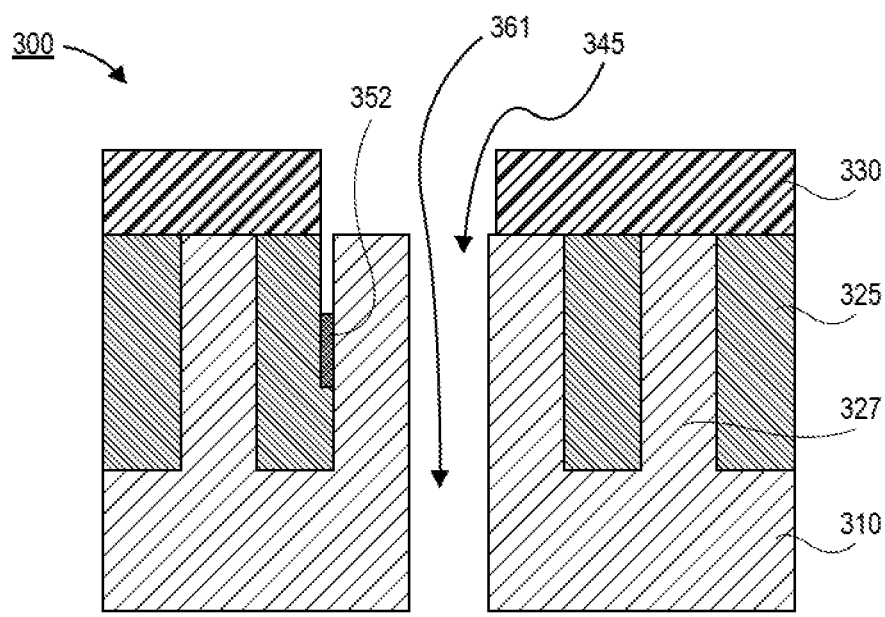
FIG. 3B is a cross-sectional illustration of the BEOL stack after an opening is patterned into the substrate, in accordance with an embodiment.
Figure 3C:
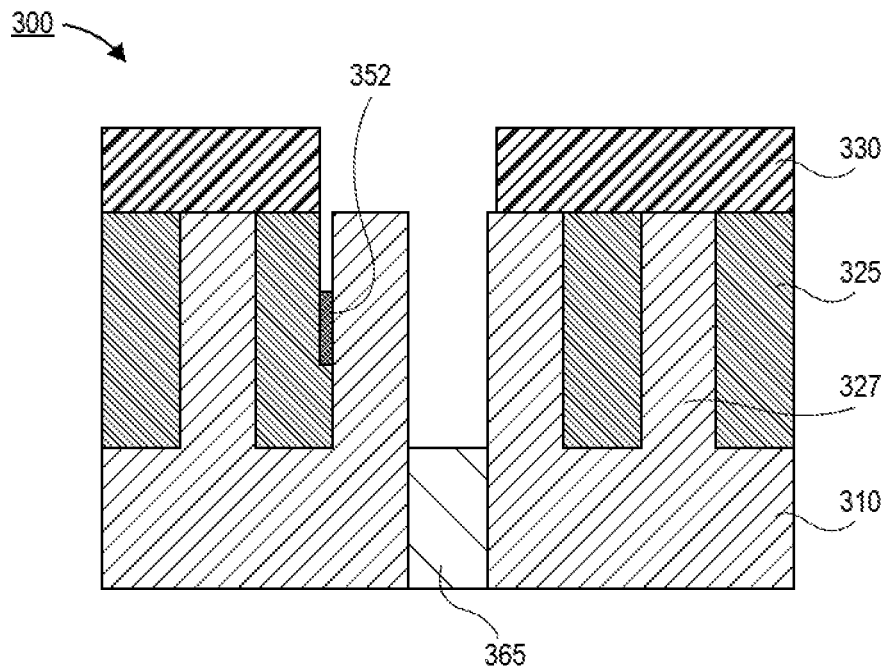
FIG. 3C is a cross-sectional illustration of the BEOL stack after a fill material is disposed in the opening in the substrate, in accordance with an embodiment.

Referring now to FIGS. 3A-3C, cross-sectional illustrations of an alternative process for using edge placement error mitigation to form plugs, cuts, or vias are shown, in accordance with an embodiment.

Referring now to FIG. 3A, a cross-sectional illustration of a BEOL stack 300 after the mask layer is preferentially etched is shown, in accordance with an embodiment. In an embodiment, the incoming BEOL stack 300 (prior to etching the mask layer) may be substantially similar to the BEOL stack 200 illustrated in FIG. 2H. For example, the BEOL stack 300 may comprise a substrate 310, a grating comprising first lines 325 and second lines 327, and a resist layer 330 with an opening 335. However, instead of an anisotropic etch to remove only portions of the mask layer along horizontal surfaces, the preferential etching in FIG. 3A is an anisotropic etch. The use of an anisotropic etching process removes substantially all of the mask layer in the opening 345 but does not entirely clear the mask layer portions 352 in the edge placement error opening 342. For example, a timed anisotropic etch may be used in order to maintain some of the portion 352 of the mask layer in the edge placement error opening 342.

Referring now to FIG. 3B, a cross-sectional illustration after the exposed portions of the first line 325 are removed, and the opening 345 is transferred into the substrate 310 to form opening 361 is shown, in accordance with an embodiment. In an embodiment, since there are no residual portions of the mask layer along the sidewalls of the second lines 327, the opening 361 may be substantially the same width as the opening 345.

Referring now to FIG. 3C, a cross-sectional illustration after a fill material 365 is disposed into the opening 361 in the substrate 310 is shown, in accordance with an embodiment. In an embodiment, the fill material 365 may be an insulating material (e.g., to form a plug) or a conductive material (e.g., to form a conductive via).

Referring now to FIGS. 4A-4E, a series of cross-sectional illustrations depicting a process for forming plugs, cuts, and/or vias with an edge placement error mitigation scheme is shown, in accordance with an additional embodiment. In FIGS. 4A-4E, the grating only includes first lines 425. That is, the second lines (shown in FIGS. 2A-3C) are omitted and portions of the surface of the substrate 410 are exposed between the first lines 425. In an embodiment, the plan view illustrations in FIGS. 2A-2M may be substantially similar to plan view illustrations of the processing in FIGS. 4A-4E, and therefore, will be omitted here.

Figure 4A:
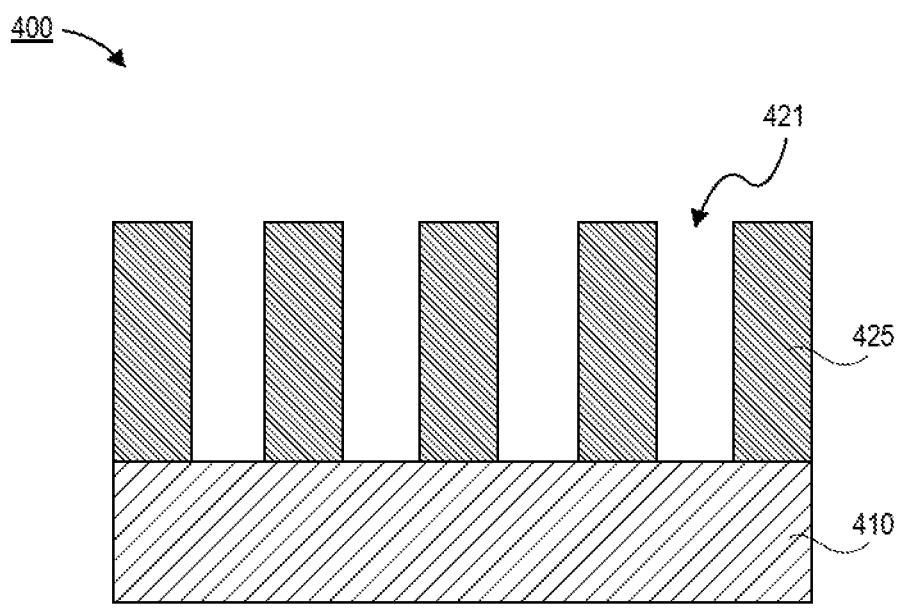
FIG. 4A is a cross-sectional illustration of a BEOL stack with a grating over a substrate, in accordance with an embodiment.

Referring now to FIG. 4A, a cross-sectional illustration of a BEOL stack 400 is shown, in accordance with an embodiment. In an embodiment, the BEOL stack 400 comprises a substrate 410 and a plurality of first lines 425 over the substrate to form a grating. That is, the first lines 425 may be substantially parallel lines and formed at a regular pitch. In an embodiment, openings 421 may be positioned between the first lines 425 and expose a portion of the substrate 410. In an embodiment, the substrate 410 may be substantially similar to the substrate 210 described above, and the first lines 425 may be substantially similar to the first lines 225 described above.

Figure 4B:
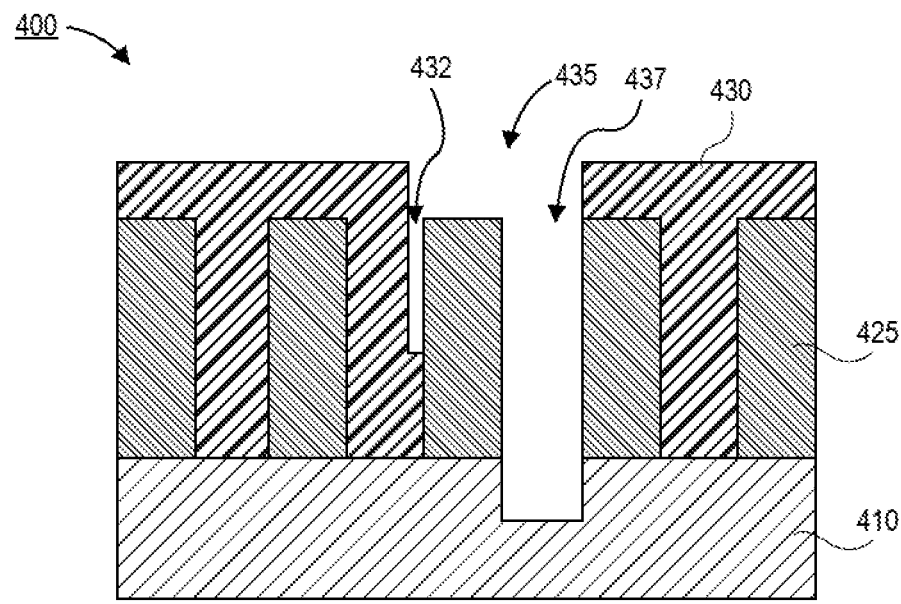
FIG. 4B is a cross-sectional illustration of the BEOL stack after a resist layer is disposed over the grating and patterned, in accordance with an embodiment.

Referring now to FIG. 4B, a cross-sectional illustration of the BEOL stack 400 after a resist material 430 is disposed over the BEOL stack 400 and patterned is shown, in accordance with an embodiment. In an embodiment, the opening 435 in the resist material 430 may comprise a first opening 437 and an edge placement error opening 432. The first opening 437 may be entirely clear of the resist material 430. The edge placement error opening 432 may be along a surface of the first line 425 opposite from the first opening 437. In an embodiment, the resist material 430 below the edge placement error opening 432 is not entirely cleared. For example, the resist material 430 below the edge placement error opening 432 may not be entirely cleared because the exposure dosage is lower compared to the exposure dosage applied to the resist material 430 in the first opening 437. In an embodiment, after patterning the resist material 430, the first opening 437 may be transferred into the substrate 410.

Figure 4C:
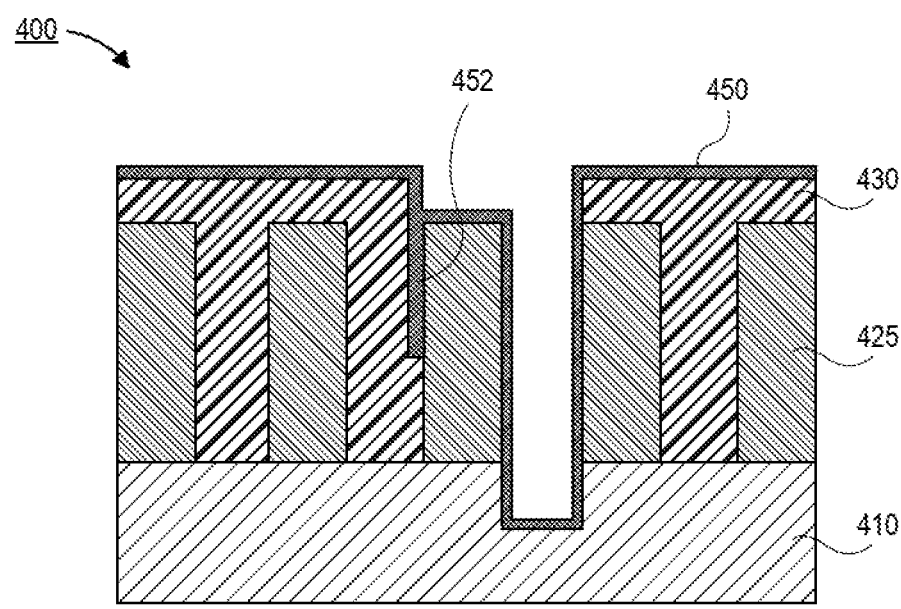
FIG. 4C is a cross-sectional illustration of the BEOL stack after a mask layer is disposed over the exposed surfaces, in accordance with an embodiment.

Referring now to FIG. 4C, a cross-sectional illustration after a mask layer 450 is disposed over exposed surfaces of the BEOL stack 400 is shown, in accordance with an embodiment. In an embodiment, the mask layer 450 is a conformally deposited layer. For example, the mask layer 450 may be substantially similar to the mask layer 250 described above. In an embodiment, the edge placement error opening is substantially filled by a portion 452 of the mask layer 450.

Figure 4D:
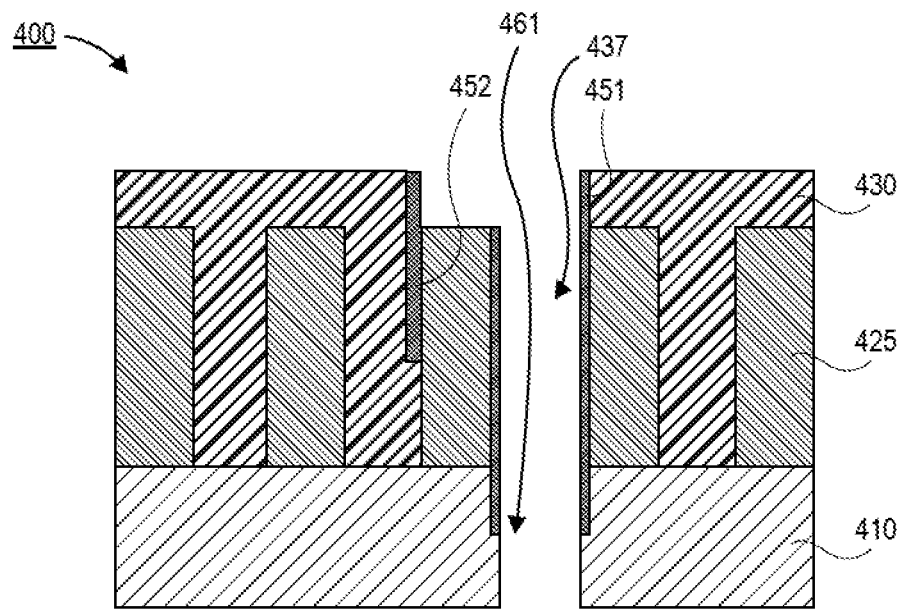
FIG. 4D is a cross-sectional illustration of the BEOL stack after portions of the mask layer along horizontal surfaces are removed and an opening in the substrate is patterned, in accordance with an embodiment.

Referring now to FIG. 4D, a cross-sectional illustration of the BEOL stack 400 after the mask layer 450 is preferentially etched and the first opening 437 is transferred into the substrate 410 is shown, in accordance with an embodiment. In an embodiment, the mask layer 450 may be preferentially etched with an anisotropic etching process that preferentially removes the portions of the mask layer along horizontal surfaces. Accordingly, the portion 452 in the edge placement error opening 432 and portions 451 along vertical surfaces of the first lines 425 remain. Since the sidewall portions 451 of the mask layer 450 remain, the opening 461 patterned into the substrate 410 may have a width that is less than the width of the first opening 437.

Figure 4E:
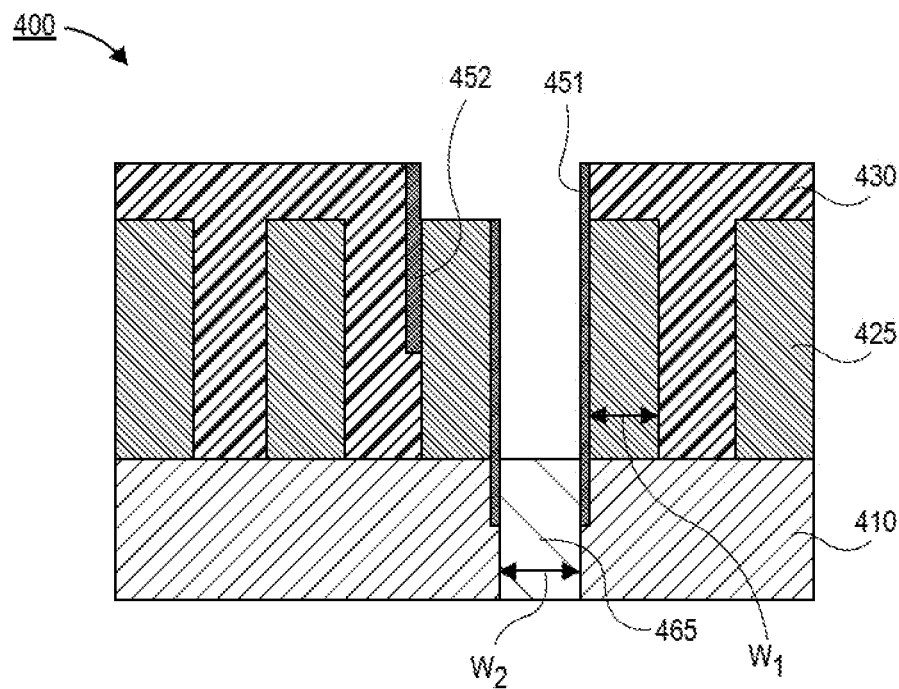
FIG. 4E is a cross-sectional illustration of the BEOL stack after a fill material is disposed in the opening in the substrate, in accordance with an embodiment.

Referring now to FIG. 4E, a cross-sectional illustration of the BEOL stack 400 after a fill material 465 is disposed in the opening 461 is shown, in accordance with an embodiment. In an embodiment, the fill material 465 may be a conductive material in order to form a via. In other embodiments, the fill material 465 may be an insulating material to form a plug. In an embodiment, the first lines 425 may have a first width $W_1$ that is greater than a second width $W_2$ of the fill material 465.

After the deposition of the fill material 465, further processing may be implemented to provide interconnects over the fill material 465. For example, conductive material may be deposited between the first lines 425. In some embodiments, the first lines 425 may be subsequently removed. In other embodiments, the first lines 425 may remain in the final structure. In some embodiments, the entirety of the mask layer 450 (including portions 451 and 452) may be removed from the final structure. In other embodiments, some portions of the mask layer may remain in the final structure. For example, sidewall portions 451 of the mask layer contacting the fill material 465 may remain in the final structure. That is, in some embodiments, a cross-sectional analysis of the device may exhibit a layer that comprises a first ILD material with small slivers of a second ILD material (i.e., portions 452). The second ILD material may have a different material composition than a material composition of the first ILD and/or the second ILD may have a different crystal structure than the first ILD. While the entirety of the mask layer 450 may be removed in some embodiments, it is to be appreciated that artifacts of the edge placement error mitigation scheme may be left in the final structure. For example, a width of the fill material may be smaller than a width of the overlying interconnects, a centerline of the fill material may be coincident with a centerline of an overlying interconnect, and/or the fill material may have a pair of opposing sidewall surfaces that are parallel, and a pair of opposing sidewall surfaces that are non-parallel.

Figure 5A:
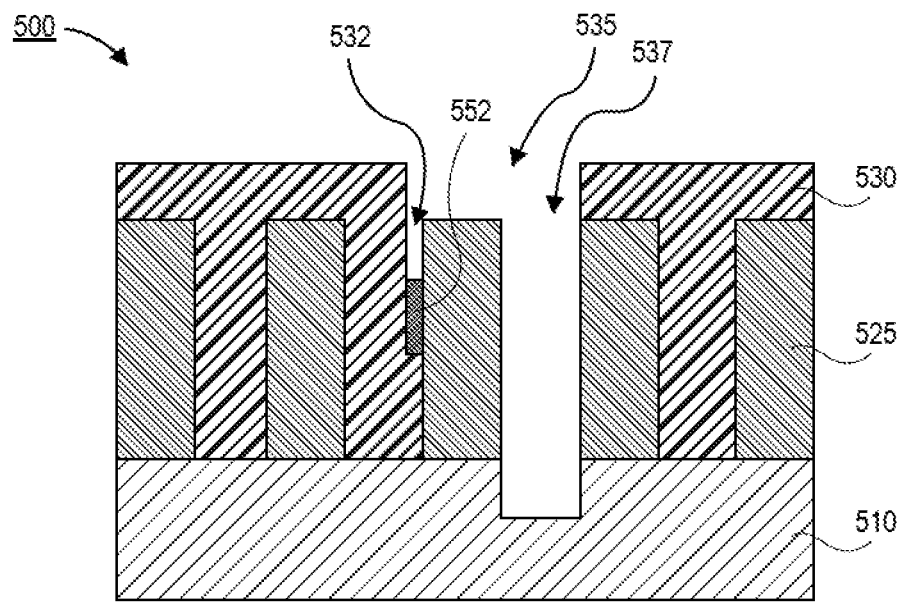
FIG. 5A is a cross-sectional illustration of a BEOL stack after an isotropic etch is used to remove portions of the mask layer, in accordance with an embodiment.
Figure 5B:
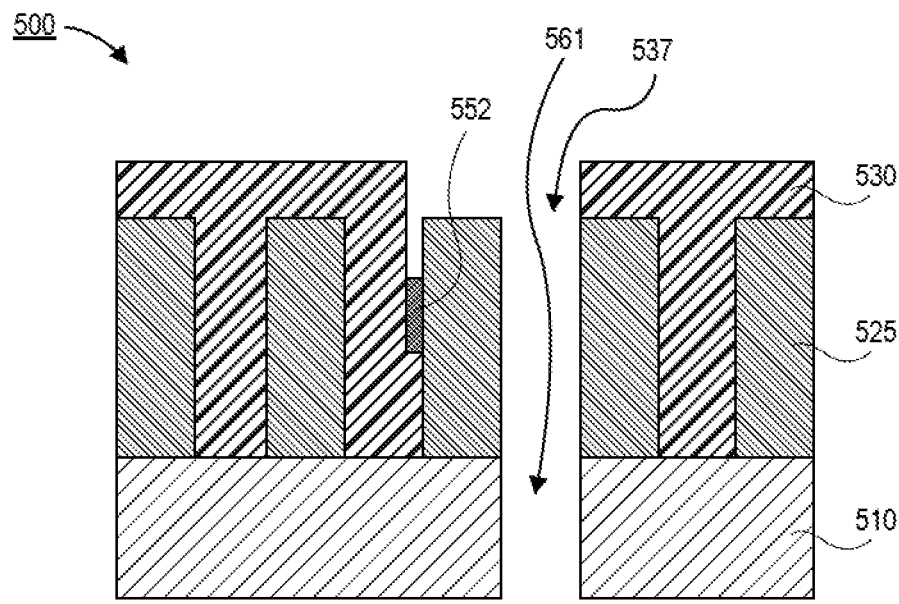
FIG. 5B is a cross-sectional illustration of the BEOL stack after an opening is patterned into the substrate, in accordance with an embodiment.
Figure 5C:
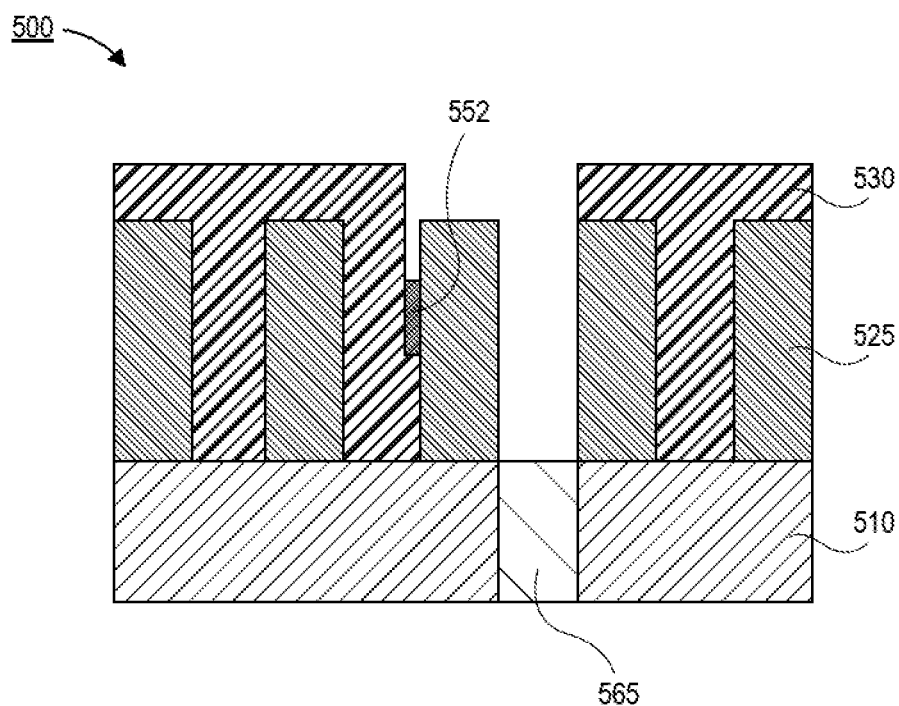
FIG. 5C is a cross-sectional illustration of the BEOL stack after a fill material is disposed in the opening in the substrate, in accordance with an embodiment.

Referring now to FIGS. 5A-5C, a series of cross-sectional illustrations depicting a process for forming a plug and/or via in a BEOL stack 500 is shown, in accordance with an additional embodiment.

Referring now to FIG. 5A, a cross-sectional illustration of a BEOL stack 500 after the mask layer is preferentially etched is shown, in accordance with an embodiment. In an embodiment, the incoming BEOL stack 500 (prior to etching the mask layer) may be substantially similar to the BEOL stack 400 illustrated in FIG. 4D. For example, the BEOL stack 500 may comprise a substrate 510, a grating comprising first lines 525, and a resist material 530 with an opening 535 comprising a first opening 537 and an edge placement error opening 532. However, instead of an anisotropic etch to remove only portions of the mask layer along horizontal surfaces, the preferential etching in FIG. 5A is an anisotropic etch. The use of an anisotropic etching process removes substantially all of the mask layer in the first opening 537 but does not entirely clear the mask layer portions 552 in the edge placement error opening 532. For example, a timed anisotropic etch may be used in order to maintain some of the portion 552 of the mask layer in the edge placement error opening 532.

Referring now to FIG. 5B, a cross-sectional illustration after the first opening 537 is transferred into the substrate 510 to form opening 561 is shown, in accordance with an embodiment. In an embodiment, since there are no residual portions of the mask layer along the sidewalls of the first lines 525, the opening 561 may be substantially the same width as the first opening 537.

Referring now to FIG. 5C, a cross-sectional illustration after a fill material 565 is disposed into the opening 561 in the substrate 510 is shown, in accordance with an embodiment. In an embodiment, the fill material 565 may be an insulating material (e.g., to form a plug) or a conductive material (e.g., to form a conductive via).

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 6:
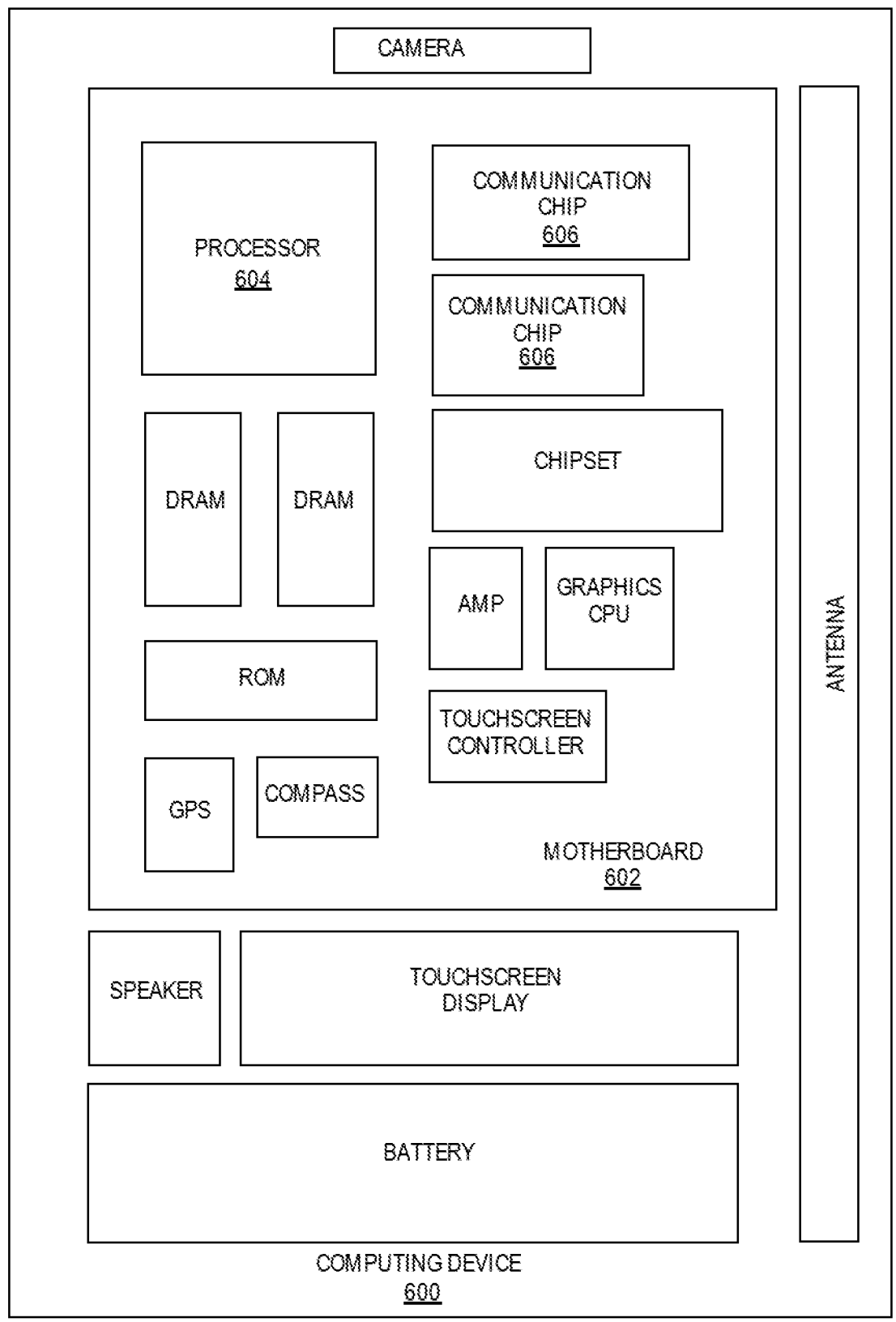
FIG. 6 illustrates a computing device in accordance with one implementation of an embodiment of the disclosure.

FIG. 6 illustrates a computing device 600 in accordance with one implementation of an embodiment of the disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In an embodiment, the integrated circuit die of the processor may comprise a BEOL stack that comprises one or more plugs, vias, and/or cuts that are manufactured using an edge placement error mitigation scheme, as described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In an embodiment, the integrated circuit die of the communication chip m may comprise a BEOL stack that comprises one or more plugs, vias, and/or cuts that are manufactured using an edge placement error mitigation scheme, as described herein.

In further implementations, another component housed within the computing device 600 may comprise a BEOL stack that comprises one or more plugs, vias, and/or cuts that are manufactured using an edge placement error mitigation scheme, as described herein.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
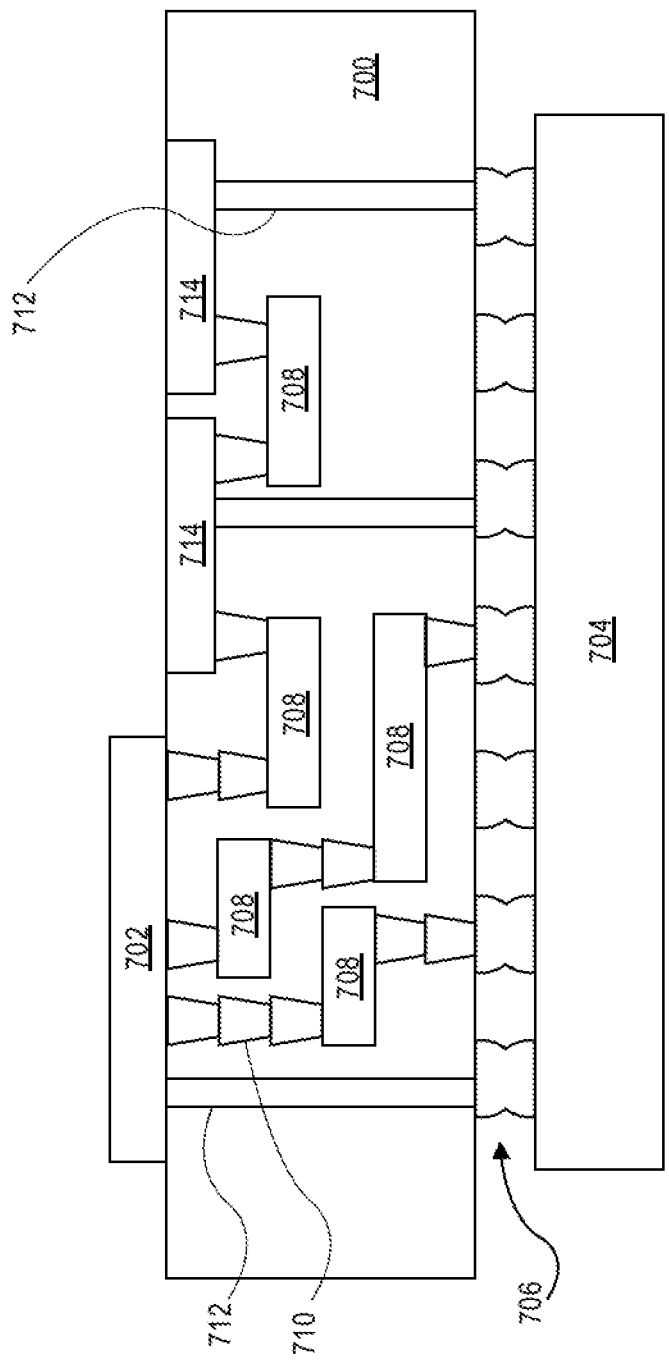
FIG. 7 is an interposer implementing one or more embodiments of the disclosure.

FIG. 7 illustrates an interposer 700 that includes one or more embodiments of the disclosure. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. In an embodiment, one of both of the first substrate 702 and the second substrate 704 may comprise a BEOL stack that comprises one or more plugs, vias, and/or cuts that are manufactured using an edge placement error mitigation scheme, in accordance with embodiments described herein. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the disclosure, apparatuses or processes disclosed herein may be used in the fabrication of interposer 700.

Thus, embodiments of the present disclosure may comprise a BEOL stack that comprises one or more plugs, vias, and/or cuts that are manufactured using an edge placement error mitigation scheme, and the resulting structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a method of fabricating an interconnect layer over a semiconductor die, comprising: forming a patterned layer over a substrate; disposing a resist layer over the patterned layer; patterning the resist layer to expose portions of the patterned layer, wherein overlay misalignment during the patterning results in the formation of edge placement error openings; correcting the edge placement error openings; and patterning an opening into the substrate after correcting edge placement error openings.

Example 2: the method of Example 1, wherein correcting edge placement error openings, comprises: conformally depositing a mask layer over exposed surfaces, wherein the mask layer fills the edge placement error openings; and etching the mask layer, wherein etching the mask layer removes portions of the mask layer over horizontal surfaces.

Example 3: the method of Example 2, wherein etching the mask layer is implemented with an anisotropic etching process.

Example 4: the method of Example 2, wherein etching the mask layer is implemented with an isotropic etching process, and wherein the portion of the mask layer in the edge placement error opening is not entirely removed.

Example 5: the method of Examples 1-4, wherein a conductive material is deposited into the opening in the substrate to form a via.

Example 6: the method of Examples 1-4, wherein an insulating material is deposited into the opening in the substrate to form a plug.

Example 7: a method of fabricating a semiconductor device, comprising: fabricating a grating over a substrate, wherein the grating comprises alternating first lines and second lines, wherein the first lines are etch selective to the second lines; disposing a resist layer over the grating; forming an opening in the resist layer, wherein the opening exposes a portion of a first line; recessing the exposed portion of the first line; depositing a mask layer over exposed surfaces of the semiconductor device, wherein the mask layer is a conformal layer; etching the mask layer with an etching process that removes portions of the mask layer along horizontal surfaces; removing the remaining portion of the exposed first line; and forming an opening into the substrate using the remaining portion of the grating and the remaining portion of the mask layer as an etching mask.

Example 8: the method of Example 7, wherein the opening in the resist layer further exposes a portion of a neighboring first line.

Example 9: the method of Example 8, wherein recessing the exposed portion of the first line further comprises recessing a portion of the neighboring first line to form an edge placement error opening.

Example 10: the method of Example 9, wherein the edge placement error opening is filled by the mask layer.

Example 11: the method of Example 10, wherein the etching process is an isotropic etching process, wherein the mask layer only remains in the edge placement error opening.

Example 12: the method of Examples 7-11, further comprises disposing a fill material into the opening in the substrate.

Example 13: the method of Example 12, wherein the fill material is a conductive material.

Example 14: the method of Example 12, wherein the fill material is an insulative material.

Example 15: the method of Examples 7-14, wherein a width of the fill material is less than a width of the first lines.

Example 16: the method of Examples 7-10 and 13-15, wherein the etching process is an anisotropic etching process that leaves portions of the mask layer along vertical surfaces.

Example 17: a semiconductor device, comprising: a semiconductor substrate; a back end of line (BEOL) stack over the semiconductor substrate, wherein the BEOL stack comprises a plurality of conductive traces, conductive vias, and insulating plugs, and wherein the conductive vias or insulating plugs comprise: a first sidewall; a second sidewall opposite the first sidewall, wherein the first sidewall and the second sidewall are substantially parallel to each other; a third sidewall; and a fourth sidewall opposite the third sidewall, wherein the third sidewall and the fourth sidewall are not substantially parallel to each other, and wherein a centerline of the conductive via or a centerline of the insulating plug is coincident with a centerline of an overlying conductive trace.

Example 18: the semiconductor device of Example 17, wherein a width between the first sidewall and the second sidewall is smaller than a width of the overlying conductive trace.

Example 19: the semiconductor device of Example 18, wherein the an upper portion of the conductive vias or an upper portion of the insulating plugs are lined by a first dielectric material, and wherein a lower portion of the conductive vias or a lower portion of the insulating plugs are lined by a second dielectric material.

Example 20: the semiconductor device of Examples 17-19, further comprising: a grating in the BEOL stack, wherein the grating comprises parallel lines of a first dielectric material, and wherein at least one of the lines of the first dielectric material comprises a recess that is at least partially filled by a second dielectric material.

Example 21: the semiconductor device of Example 20, wherein the recess is along an edge of the line of the first dielectric material.

Example 22: the semiconductor device of Example 20, wherein the line of the first dielectric material comprising a recess is adjacent to one of the conductive vias or one of the insulating plugs.

Example 23: an electronic system, comprising: a motherboard; and a die electrically coupled to the motherboard, wherein the die comprises: a semiconductor substrate; and a back end of line (BEOL) stack over the semiconductor substrate, wherein the BEOL stack comprises a plurality of conductive traces, conductive vias, and insulating plugs, and wherein the conductive vias or insulating plugs comprise: a first sidewall; a second sidewall opposite the first sidewall, wherein the first sidewall and the second sidewall are substantially parallel to each other; a third sidewall; and a fourth sidewall opposite the third sidewall, wherein the third sidewall and the fourth sidewall are not substantially parallel to each other, and wherein a centerline of the conductive via or a centerline of the insulating plug is coincident with a centerline of an overlying conductive trace.

Example 24: the electronic system of Example 23, wherein a width between the first sidewall and the second sidewall is smaller than a width of the overlying conductive trace.

Example 25: the electronic system of Examples 23 or 24, wherein the an upper portion of the conductive vias or an upper portion of the insulating plugs are lined by a first dielectric material, and wherein a lower portion of the conductive vias or a lower portion of the insulating plugs are lined by a second dielectric material.

What is claimed is:

1. A method of fabricating an interconnect layer over a semiconductor die, comprising:
   forming a patterned layer over a substrate;
   disposing a resist layer over the patterned layer;
   patterning the resist layer to expose portions of the patterned layer, wherein overlay misalignment during the patterning results in the formation of edge placement error openings;
   correcting the edge placement error openings, wherein correcting edge placement error openings, comprises:
      conformally depositing a mask layer over exposed surfaces, wherein the mask layer fills the edge placement error openings; and
      etching the mask layer, wherein etching the mask layer removes portions of the mask layer over horizontal surfaces; and
   patterning an opening into the substrate after correcting edge placement error openings.

2. The method of claim 1, wherein etching the mask layer is implemented with an anisotropic etching process.

3. The method of claim 1, wherein etching the mask layer is implemented with an isotropic etching process, and wherein the portion of the mask layer in the edge placement error openings is not entirely removed.

4. The method of claim 1, wherein a conductive material is deposited into the opening in the substrate to form a via.

5. The method of claim 1, wherein an insulating material is deposited into the opening in the substrate to form a plug.

* * * * *